(12) United States Patent
Soininen et al.

(10) Patent No.: US 11,702,745 B2
(45) Date of Patent: Jul. 18, 2023

(54) NOZZLE AND NOZZLE HEAD

(71) Applicant: Beneq Oy, Espoo (FI)

(72) Inventors: Pekka Soininen, Espoo (FI); Mika Jauhiainen, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 16/755,712

(22) PCT Filed: Oct. 17, 2018

(86) PCT No.: PCT/FI2018/050756
§ 371 (c)(1),
(2) Date: Apr. 13, 2020

(87) PCT Pub. No.: WO2019/077205
PCT Pub. Date: Apr. 25, 2019

(65) Prior Publication Data
US 2020/0385863 A1 Dec. 10, 2020

(30) Foreign Application Priority Data

Oct. 18, 2017 (FI) .................................. 20175919

(51) Int. Cl.
*C23C 16/455* (2006.01)
*C23C 16/54* (2006.01)

(52) U.S. Cl.
CPC .. *C23C 16/45578* (2013.01); *C23C 16/45551* (2013.01); *C23C 16/45574* (2013.01); *C23C 16/545* (2013.01)

(58) Field of Classification Search
CPC ........ C23C 16/45563; C23C 16/45519; C23C 16/45551; C23C 16/45578; C23C 16/45574; C23C 16/545; C23C 16/4412
See application file for complete search history.

(56) References Cited

U.S. PATENT DOCUMENTS 8,304,019 B1 * 11/2012 Pichler .................... C23C 16/56
427/248.1
2006/0127599 A1 * 6/2006 Wojak ................... C23C 16/453
423/446
(Continued)

FOREIGN PATENT DOCUMENTS

CN 103628045 B 9/2015
EP 3004417 A1 4/2016
(Continued)

OTHER PUBLICATIONS

Finnish Patent and Registration Office, Search Report dated Jun. 18, 2018 issued in Finnish Patent Application No. 20175919.
(Continued)

*Primary Examiner* — Aiden Lee
(74) *Attorney, Agent, or Firm* — Robert P. Michal; Carter, DeLuca & Farrell LLP

(57) ABSTRACT

The invention relates to a nozzle and nozzle head arranged to supply gas towards a surface of a substrate The nozzle comprises a nozzle output surface via which the gas is supplied towards the surface of the substrate, a nozzle top surface opposite the nozzle output surface, and a nozzle side wall extending between the nozzle output surface and the nozzle top surface. The nozzle further comprises at least one recess provided to the nozzle side wall, the at least one recess extending between the nozzle top surface and the nozzle output surface for providing a gas passage from the nozzle top surface to the nozzle output surface when the nozzle side wall is against a counter surface.

9 Claims, 12 Drawing Sheets

(56) References Cited

U.S. PATENT DOCUMENTS

| | | | |
|---|---|---|---|
| 2007/0026540 A1* | 2/2007 | Nooten | H01L 29/66181 |
| | | | 438/5 |
| 2011/0033638 A1* | 2/2011 | Ponnekanti | C23C 16/483 |
| | | | 427/569 |
| 2013/0001330 A1 | 1/2013 | Huang | |
| 2013/0005057 A1 | 1/2013 | Kim et al. | |
| 2013/0017318 A1* | 1/2013 | Seo | C23C 16/45589 |
| | | | 118/721 |
| 2013/0092085 A1* | 4/2013 | Lee | C23C 16/45551 |
| | | | 118/719 |
| 2014/0065307 A1 | 3/2014 | Lee | |
| 2015/0004318 A1* | 1/2015 | Alasaarela | C23C 16/45574 |
| | | | 427/255.28 |
| 2015/0376793 A1* | 12/2015 | Carlson | C23C 16/4587 |
| | | | 118/715 |
| 2016/0226031 A1* | 8/2016 | Jang | H01L 51/0097 |

FOREIGN PATENT DOCUMENTS

| | | |
|---|---|---|
| WO | 2009142487 A1 | 11/2009 |
| WO | 2012028782 A1 | 3/2012 |
| WO | 2013121102 A2 | 8/2013 |
| WO | 2013142344 A1 | 9/2013 |
| WO | 2014193234 A1 | 12/2014 |

OTHER PUBLICATIONS

ISA/FI, PCT International Search Report and Written Opinion dated Feb. 14, 2019 issued in PCT International Application No. PCT/FI2018/050756.

Supplementary European Search Report dated Dec. 22, 2020, issued in corresponding EP Application No. 18867808, 14 pages.

* cited by examiner

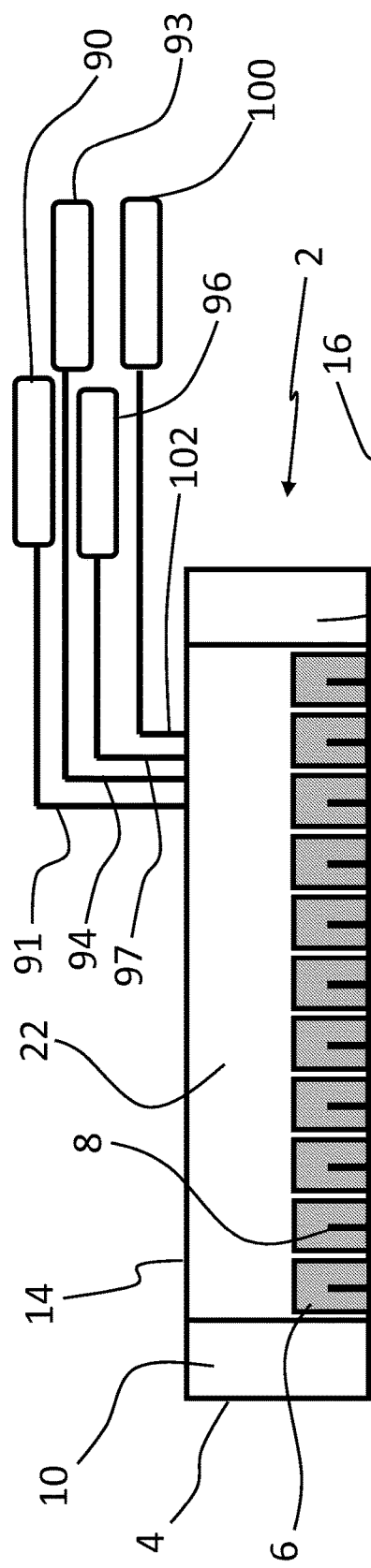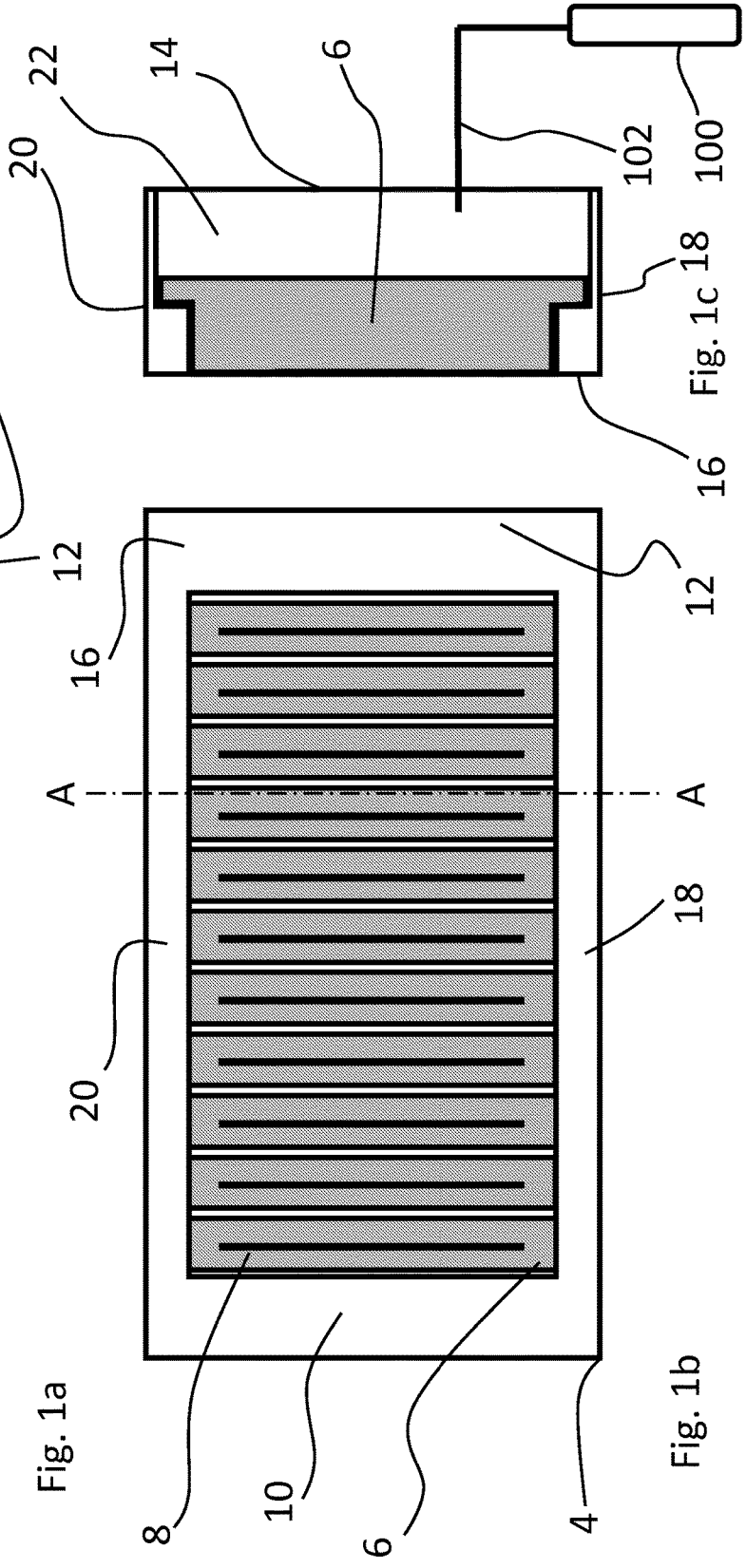

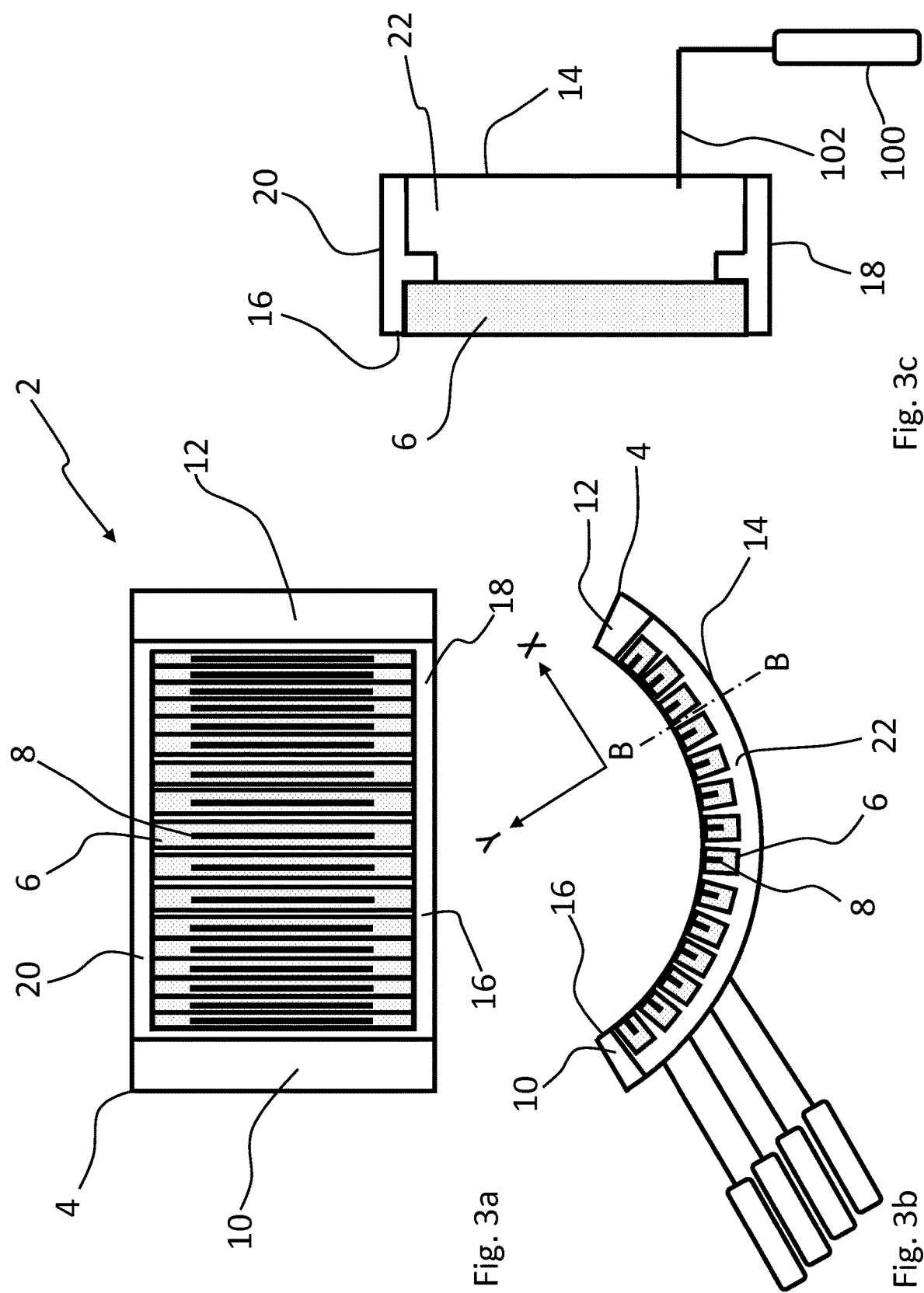

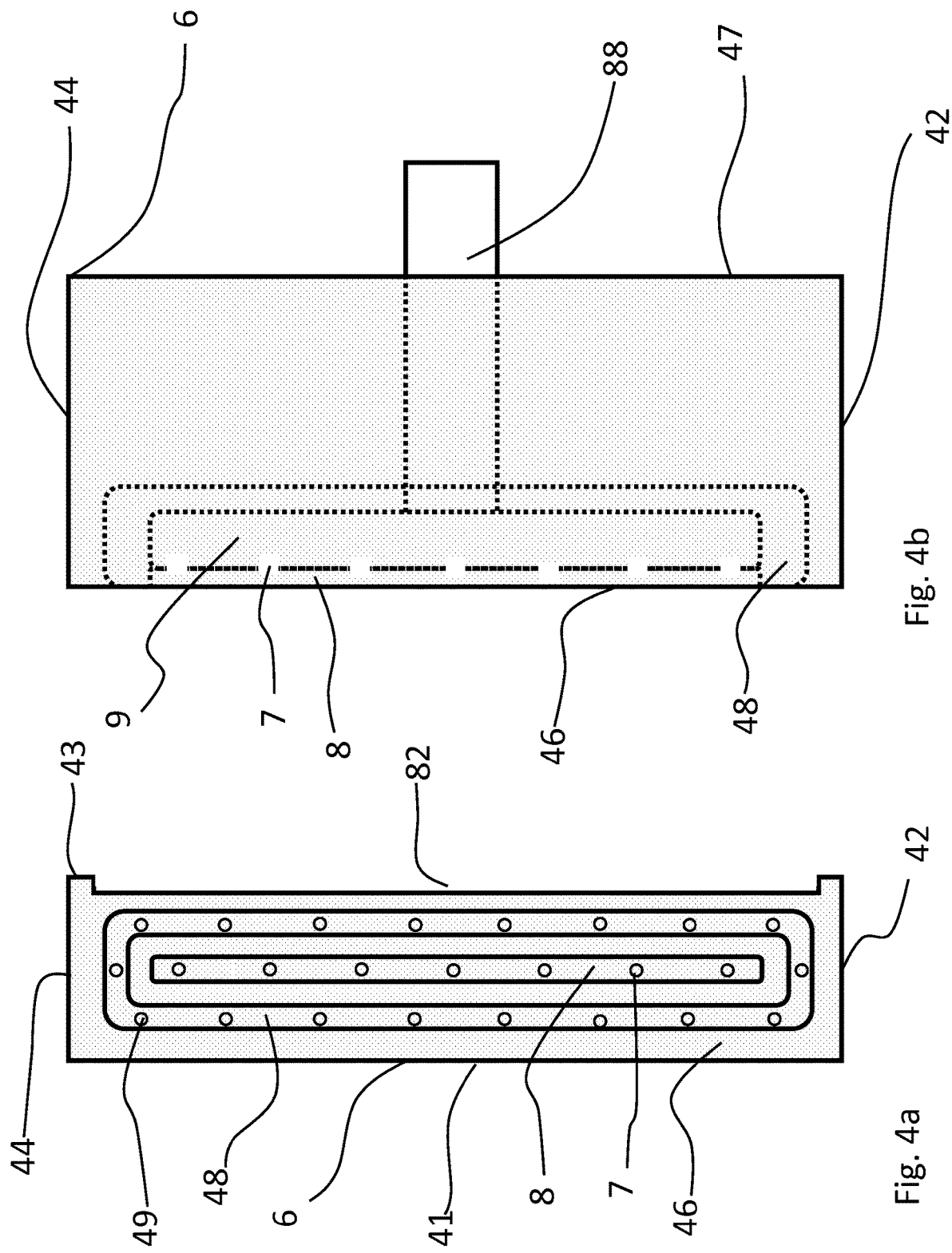

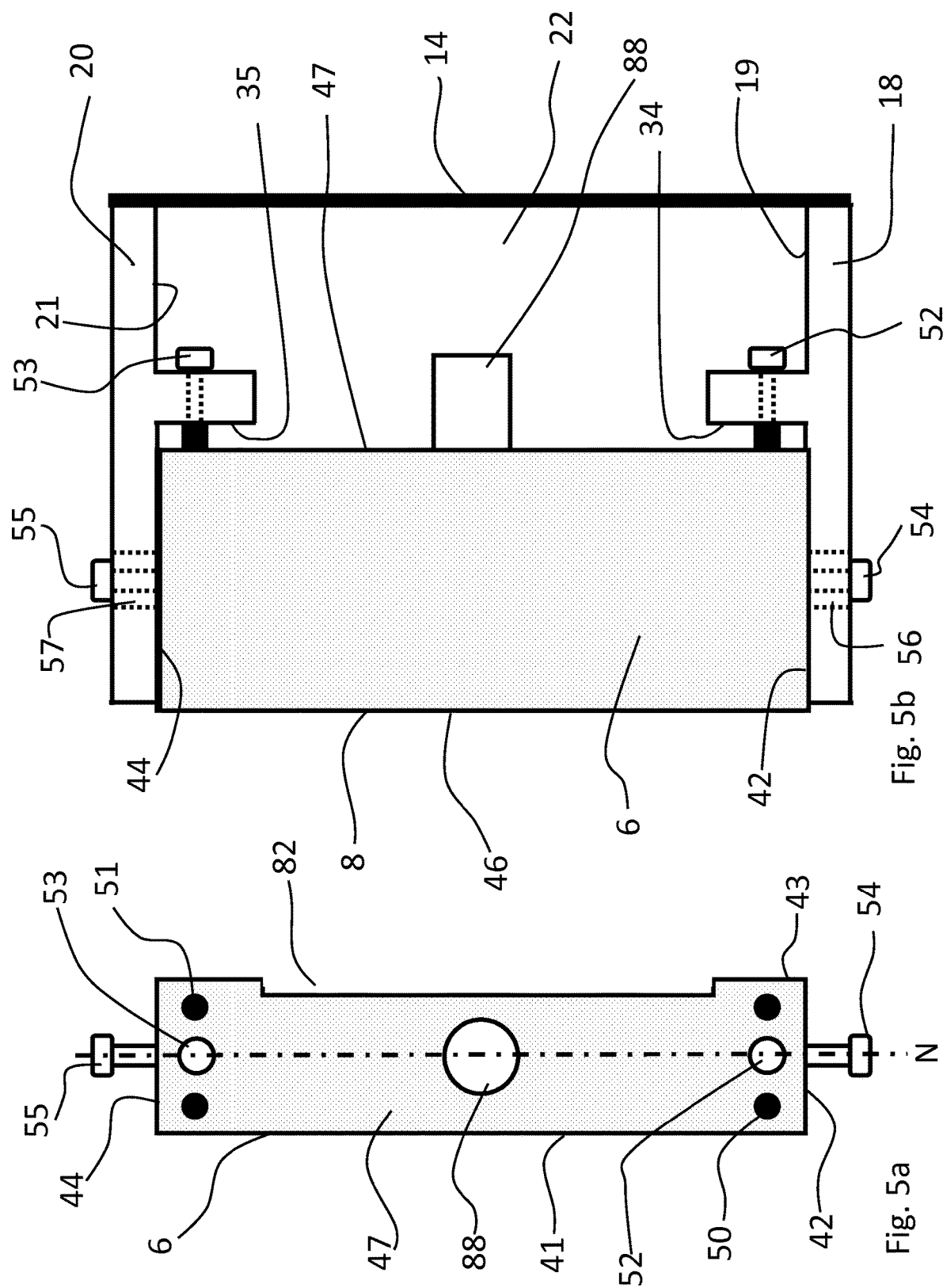

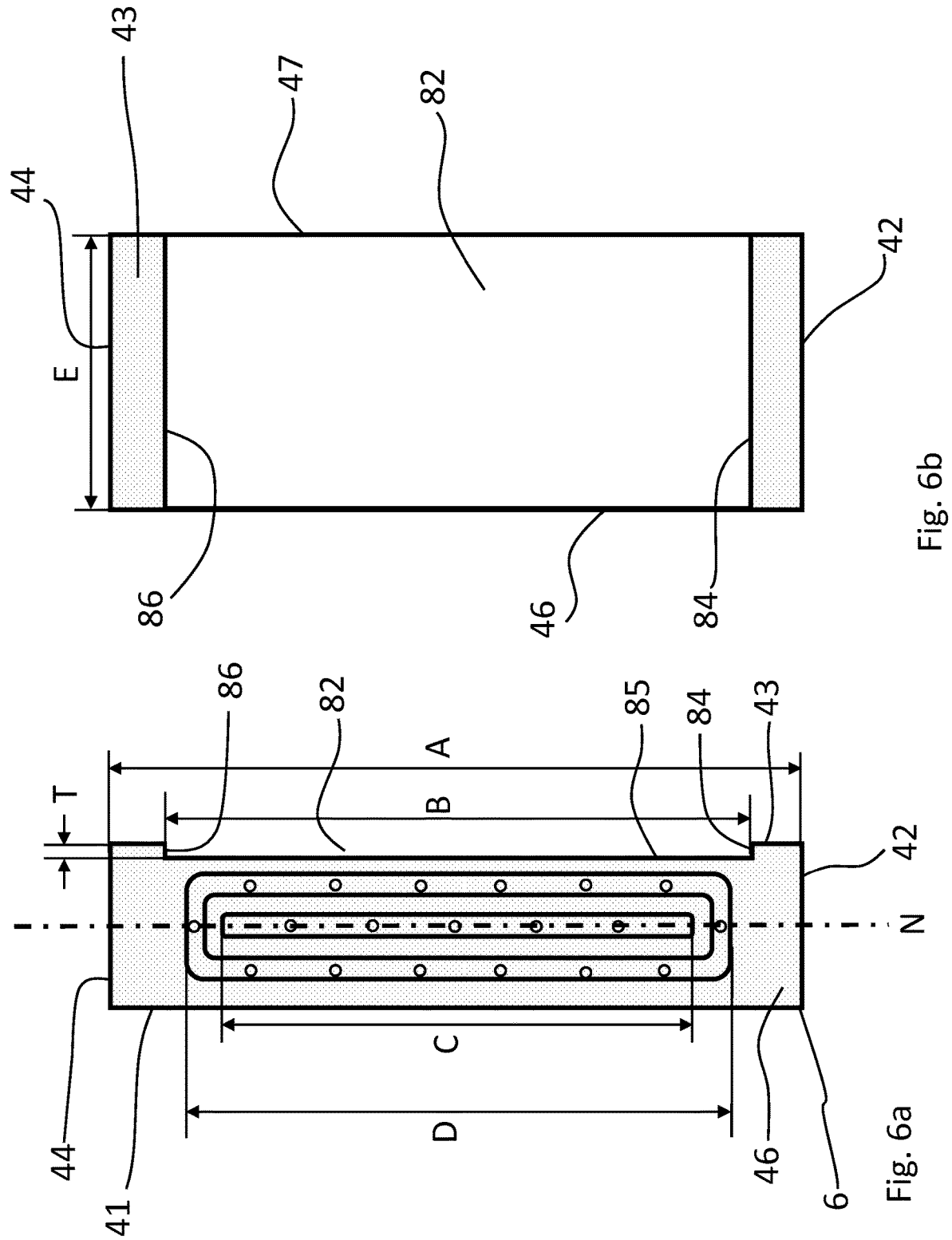

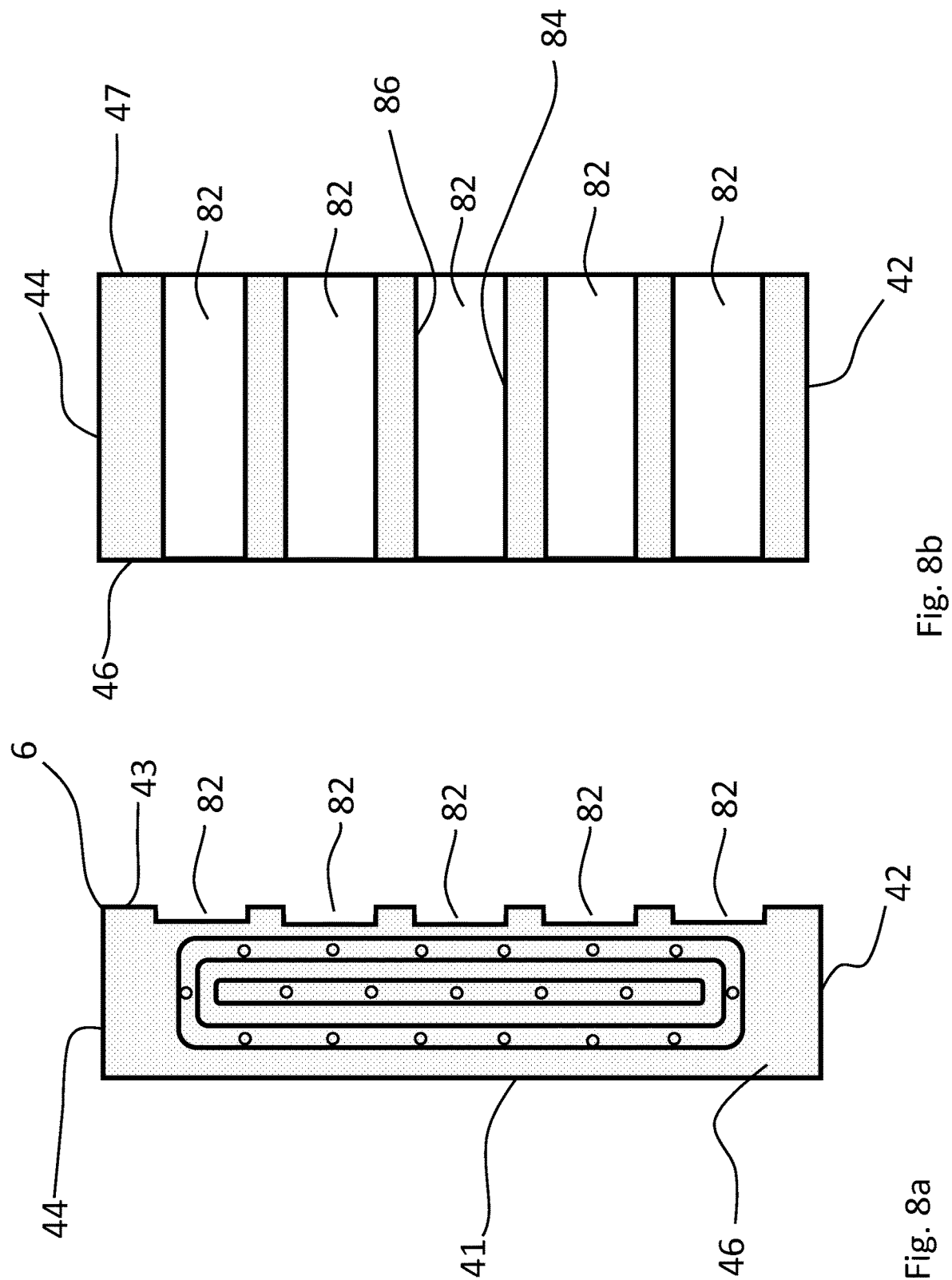

NOZZLE AND NOZZLE HEAD

CROSS-REFERENCE TO RELATED APPLICATIONS

This application is the United States National Stage entry under 35 U.S.C. 371 of PCT/FI2018/050756, filed Oct. 17, 2018, which in turn claims the priority of Finnish Patent Application No. 20175919, filed Oct. 18, 2017, the contents of each of which are hereby incorporated by reference in their entirety.

FIELD OF THE INVENTION

The present invention relates to a nozzle arranged to supply gas towards a surface of a substrate for subjecting the surface of the substrate to surface reaction of the precursor gas according to the principles of atomic layer deposition, and more particularly to a nozzle according to preamble of claim 1. The present invention further relates to a nozzle head for subjecting a surface of a substrate to successive surface reactions of at least two precursors according to the principles of atomic layer deposition, and more particularly to a nozzle head according to preamble of claim 8.

BACKGROUND OF THE INVENTION

Nozzle heads are commonly used in atomic layer deposition (ALD) for subjecting a surface of the substrate to successive surface reactions of at least two precursors. The nozzle head comprises an output surface via which precursor gases are supplied towards the substrate. The output surface is provided with two or more nozzles from which the precursors are supplied. In this kind of spatial ALD processes the precursor gasses are separated in space. With careful management of gas flow and by applying relative movement between the substrate and spatially separated gasses, it is possible to apply the coating continuously on moving substrates at high speeds. During the spatial ALD process the nozzle head is moved relative to the substrate, and/or the substrate is moved relative to the nozzle head, over the surface of the substrate such that there is small gap between the output surface and the surface of the substrate. In ALD process the surface of the substrate is subjected successively to at least different precursors. In spatial ALD this is achieved by supplying the at least two different precursors locally to the surface of the substrate and separated in time and space. This is achieved by providing the output surface of the nozzle head successively with different precursor nozzles arranged to supply different precursors. The different precursors have to be separated from each other of the output surface of the nozzle head such that they do not react with each other in gas phase. Therefore, the nozzle head comprises successively separate nozzles arranged adjacent to each other at the output surface of the nozzle head. The adjacent nozzles supply different precursors and between the different precursor supplies there is provided at least one purge gas supply and at least one discharge. The discharge removes the precursor gases and the purge gas from the surface of the substrate and the purge gas. Accordingly, each nozzle comprises at least a precursor supply channel open to the output surface, a purge gas channel open to the output surface and a discharge channel open to the output surface.

The adjacent nozzles have to be sealed against each other for preventing additional uncontrolled gas flows from between the nozzle to flow to the output surface. Uncontrolled gas flows may compromise the flow dynamics at the output surface and cause deterioration of the ALD process. In the prior art, the sealing of the adjacent nozzles is carried out with elastomer seals provided between the adjacent nozzles.

During processing the process temperature is conventionally been about 150° C. or less. The nozzle head is also heated to the process temperature in order to control the process in great detail. However, there is problem when the process temperature is increased from 150° C., in cases up to 300° C. or 350° C. or even more. The elastomer seals between the adjacent nozzle do not withstand such high temperatures or their life time is considerably compromised. Furthermore, the thermal expansion of nozzles and other parts of the nozzle head may break the elastomer seals.

BRIEF DESCRIPTION OF THE INVENTION

An object of the present invention is to provide a nozzle and nozzle head such that the prior art disadvantages are solved or at least alleviated. The objects of the invention are achieved by a nozzle which is characterized by what is stated in the independent claim 1. The objects of the invention are further achieved by a nozzle head which is characterized by what is stated in the independent claim 8.

The preferred embodiments of the invention are disclosed in the dependent claims.

The invention is based on the idea of providing a nozzle which is arranged to supply gas towards a surface of a substrate for subjecting the surface of the substrate to surface reaction of the precursor gas according to the principles of atomic layer deposition. The nozzle comprises a nozzle output surface via which the gas is supplied towards the surface of the substrate, a nozzle top surface opposite the nozzle output surface, and a nozzle side wall extending between the nozzle output surface and the nozzle top surface. According to the present invention the nozzle further comprises at least one recess provided to the nozzle side wall. The at least one recess extends between the nozzle top surface and the nozzle output surface for providing a gas passage from the nozzle top surface to the nozzle output surface when the nozzle side wall is against a counter surface. Alternatively, the at least one recess extends along the entire height of the nozzle side wall in a direction perpendicular or transverse to the nozzle output surface. Accordingly, when the nozzle side wall is arranged against a nozzle side wall of an adjacent nozzle in the nozzle head or against a surface of the body of the nozzle head, the at least one recess provides a gas passage from the nozzle top surface to the nozzle output surface. Thus, adjacent nozzles or a nozzle and the body of the nozzle head may be sealed to each other by providing a controlled gas flow via the at least one recess when the nozzle side wall is arranged against a nozzle side wall of an adjacent nozzle in the nozzle head or against a surface of the body of the nozzle head.

In one embodiment of the present invention, the nozzle comprises a first nozzle end, a second nozzle end opposite the first nozzle end and a nozzle axis extending between the first and second nozzle ends. The nozzle further comprises one recess provided to the nozzle side wall between the first and second nozzle ends in direction of the nozzle axis. Alternatively, two or more separate recesses may be provided successively to the nozzle side wall between the first and second nozzle ends in direction of the nozzle axis. Therefore, the nozzle may comprise one or more separate recesses between the first and second nozzle ends such that one nor more separate gas passages are formed.

In one embodiment, the at least one recess has a depth from surface of the nozzle side wall. In one case, the depth of the at least one recess may be between 0.3 to 5 mm. In another case, the depth of the at least one recess may be preferably 0.5 to 3 mm. In still another case, the depth of the at least one recess may be between 0.7 and 1.5 mm. This means that, the depth of the at least one recess determines dimension of the gas passage in direction perpendicular to the nozzle side wall of the when the nozzle side wall is arranged against the counter surface. The depth of the recess may be constant from between the nozzle top surface and the nozzle output surface, or alternatively the depth of the recess may increase or decrease from the nozzle top surface to the nozzle output surface, or between the nozzle top surface or output surface.

In one embodiment, the nozzle comprises a first nozzle side wall and a nozzle second side wall and the at least one recess is provided to the first nozzle side wall or the second nozzle side wall. According, only one of the two side walls of the nozzle comprise the at least one recess. Thus, the gas passage between the nozzle top surface and the nozzle output surface may be formed with the at least one recess of the nozzle side wall and the counter surface.

In another embodiment, the nozzle comprises a first nozzle side wall and a nozzle second side wall and the at least one recess is provided to both the first nozzle side wall and to the second nozzle side wall. Thus, the gas passage between the nozzle top surface and the nozzle output surface may be formed on both opposing side wall of the nozzle and together with the recesses of the against each other arranged adjacent nozzles, or with counter surfaces on both sides of the nozzle.

In one embodiment, the at least one recess has a width in the direction of the nozzle axis, meaning direction between the first and second nozzle ends. In one case width of the at least one recess in the direction of the nozzle axis is uniform between the nozzle output surface and the nozzle top surface. Thus, in this case cross-sectional area of the gas passage may be uniform from the nozzle top surface to the nozzle output surface. In another case, the width of the at least one recess in the direction of the nozzle axis increases from the nozzle output surface towards the nozzle top surface. Therefore, in this case the cross-sectional area of the gas passage may increase from nozzle output surface to the nozzle top surface. In yet another case, the width of the at least one recess in the direction of the nozzle axis decreases from the nozzle output surface towards the nozzle top surface. Therefore, in this case the cross-sectional area of the gas passage may decreases from nozzle output surface to the nozzle top surface. In a further case, the width of the at least one recess in the direction of the nozzle axis is greater at the nozzle output surface than at the nozzle top surface. In a still further case, the width of the at least one recess in the direction of the nozzle axis is greater at the nozzle top surface than at the nozzle output surface. According to the two latter cases, the cross-sectional area of the gas passage may increase or decrease from the nozzle output surface to the nozzle top surface gradually or stepwise, or any other manner.

The nozzle output surface may comprise at least one gas channel having a length in the direction of the nozzle axis. In one embodiment, the length of the at least one gas channel in the direction of the nozzle axis may be smaller than the width of the least one recess in the direction of the nozzle axis at the nozzle output surface. According to this, the recess may form a gas passage which is extends on the nozzle output surface over the whole length of the gas channel and further past the ends of the gas channel in the direction of the nozzle axis. When purge gas is provided from the gas passage formed with the at least one recess, an efficient separation of the adjacent nozzles and precursor gas flows of adjacent nozzles is achieved.

In another embodiment, the nozzle side wall may comprise one recess and the recess may comprise a first recess side wall extending between the nozzle top surface and the nozzle output surface and from the nozzle side wall, and a second recess side wall extending between the nozzle top surface and the nozzle output surface and from the nozzle side wall. The at least one gas channel may be provided between the first and second recess side walls at the nozzle output surface such that the length of the at least one gas channel in the direction of the nozzle axis may be smaller than the width of the least one recess in the direction of the nozzle axis, at least at the nozzle output surface.

In a yet another embodiment, the nozzle side wall may comprise two or more recesses provided successively to the nozzle side wall between the first and second nozzle ends in the direction of the nozzle axis. The two or more recesses may comprise a first recess side wall extending between the nozzle top surface and the nozzle output surface and from the nozzle side wall, and a second recess side wall extending between the nozzle top surface and the nozzle output surface and from the nozzle side wall. The at least one gas channel is provided between the first recess side wall of a first of the successive recesses and the second recess side wall of a last of the successive recesses along the direction of the nozzle axis from the first nozzle end to the second nozzle end at the nozzle output surface such that the length of the at least one gas channel in the direction of the nozzle axis may be smaller than the width of the least one recess in the direction of the nozzle axis, at least at the nozzle output surface.

The nozzle may have a length between the first and second nozzle end in the direction of the nozzle axis. In one embodiment, the length of the nozzle is greater than the width of the at least one recess in the direction of the nozzle axis at the nozzle output surface. Accordingly, the at least one recess does not extend to the first and second nozzle ends, but there is nozzle side wall surface between the first and second nozzle end and the at least one recess. Therefore, side walls of the adjacent nozzles are against each other at and in vicinity of the first and second ends and the gas passage is formed such that gas may flow only from the nozzle top surface to the nozzle output surface.

In another embodiment, the nozzle side wall may comprise one recess and the recess may comprise a first recess side wall extending between the nozzle top surface and the nozzle output surface and from the nozzle side wall, and a second recess side wall extending between the nozzle top surface and the nozzle output surface and from the side wall. The first recess side wall may be at a first distance from the first nozzle end and the second recess side wall may be at a second distance from the second nozzle end at the nozzle output surface such that the length of the nozzle is greater than the width of the at least one recess in the direction of the nozzle axis at the nozzle output surface.

In an alternative embodiment, the nozzle side wall may comprise two or more recesses provided successively to the nozzle side wall between the first and second nozzle ends in the direction of the nozzle axis. The two or more recesses may comprise a first recess side wall extending between the nozzle top surface and the nozzle output surface and from the nozzle side wall, and a second recess side wall extending between the nozzle top surface and the nozzle output surface and from the nozzle side wall. The first recess side wall of a first of the successive recesses along the direction of the nozzle axis from the first nozzle end to the second nozzle end may be at a first distance from the first nozzle end and the second recess side wall of a last of the successive recesses along the direction of the nozzle axis from the first nozzle end to the second nozzle end may be at a second distance from the second nozzle end such the distance between the that the first recess side wall of the first of the successive recesses and the second recess side wall of a last of the successive recesses is smaller than the length of the nozzle.

The present invention is further based om the idea of providing a nozzle head for subjecting a surface of a substrate to successive surface reactions of at least two precursors according to the principles of atomic layer deposition. The nozzle head comprises an output surface via which at least one precursor is supplied towards the surface of the substrate, and two or more nozzles for supplying the at least one precursor. The two or more nozzles comprises a nozzle output surface via which the gas is supplied towards the surface of the substrate, a nozzle top surface opposite the nozzle output surface and a nozzle side wall extending between the nozzle output surface and the nozzle top surface. The two or more nozzles are provided adjacent to each other at the output surface such that the nozzle side walls of adjacent nozzles are towards each other. According to the present invention the adjacent nozzles of the two or more nozzles are arranged at an expansion distance from each other in the direction of the output surface such that there is an expansion gap between the nozzle side walls of the adjacent nozzles. The nozzle side wall further comprises at least one recess extending between the nozzle top surface and the nozzle output surface for providing a gas passage from the nozzle top surface to the nozzle output surface when the nozzle side walls of the adjacent nozzles are against each other. Based on the above mentioned, the expansion gap allows the nozzles to expand when the nozzle head is heated during processing such that the nozzle side walls of adjacent nozzle may expand against each other closing or almost closing the expansion gap. Furthermore, the at least one recess provides a gas passage between the adjacent nozzles from the nozzle top surface to the nozzle output surface when the expansion gap is closed.

The nozzle head may comprise a body. In one embodiment, the body may comprise a first side structure and a second side structure. The two or more nozzles are arranged adjacent to each other in a direction between the first and second side structures.

In another embodiment, the body may comprise a first side structure, a second side structure, a first end structure and a second end structure. The two or more nozzles may be arranged to extend between the first and second end structures and arranged adjacent to each other in a direction between the first and second side structures.

In one embodiment, the nozzle head may comprise a body and a nozzle head chamber inside the body. In one case, the nozzle head chamber may be provided in fluid communication with the two or more nozzles. The nozzle head chamber may be used for supplying gas to the output surface of the nozzle head via the gas passages provided with the at least one recesses. The nozzle head chamber may also enclose gas conduits for supplying gas to the nozzles.

In another case, the two or more nozzles may be arranged to form at least part of a bottom wall of the nozzle head chamber.

In an alternative case, the first side structure, the second side structure, the first end structure and the second end structure of the body may form side walls of the nozzle head chamber. The body may further comprise a top structure forming a top wall of the nozzle head chamber. The two or more nozzles may be arranged to form a bottom wall of the nozzle head chamber.

In one embodiment of the present invention, the nozzle head chamber may comprise a gas inlet arranged to supply gas into the nozzle head chamber for supplying the gas via the at least one recess through the output surface towards the surface of the substrate.

In one embodiment, the at two or more nozzles comprise a first nozzle side wall and a second nozzle side wall. In one case, the at least one recess is provided to the first nozzle side wall or the second nozzle side wall. In another case, the at least one recess is provided to the first nozzle side wall or the second nozzle side wall. The two or more nozzles may be arranged such that the first nozzle side wall of one nozzle is towards the second nozzle side wall of adjacent nozzle.

In another case, the at least one recess may be provided to the first nozzle side wall and to the second nozzle side wall.

In a yet another embodiment, the at least one recess may be provided to the first nozzle side wall and the second nozzle side wall. The two or more nozzles may be arranged such that the first nozzle side wall of one nozzle is towards the second nozzle side wall adjacent nozzle.

In one embodiment, the two or more nozzles may comprise a first nozzle end, a second nozzle end opposite the first nozzle end and a nozzle axis extending between the first and second nozzle ends. The nozzle output surface may comprise at least one gas channel open to the nozzle output surface and having a length in the direction of the nozzle axis. In one case, the length of the at least one gas channel in the direction of the nozzle axis may smaller than the width of the east one recess in the direction of the nozzle axis at the nozzle output surface.

In another case, the nozzle side wall may comprise one recess and the recess may comprise a first recess side wall extending between the nozzle top surface and the nozzle output surface and from the nozzle side wall, and a second recess side wall extending between the nozzle top surface and the nozzle output surface and from the nozzle side wall. The at least one gas channel may be provided between the first and second recess side walls at the nozzle output surface.

In one case, the nozzle side wall may comprise two or more recesses provided successively to the nozzle side wall between the first and second nozzle ends in the direction of the nozzle axis. The two or more recesses may comprise a first recess side wall extending between the nozzle top surface and the nozzle output surface and from the nozzle side wall, and a second recess side wall extending between the nozzle top surface and the nozzle output surface and from the nozzle side wall. The at least one gas channel may be provided between the first recess side wall of a first of the successive recesses and the second recess side wall of a last of the successive recesses along the direction of the nozzle axis from the first nozzle end to the second nozzle end at the nozzle output surface.

The at least one recess has a depth from surface of the nozzle side wall, and that the depth of the at least one recess may be between 0.3 to 5 mm, preferably 0.5 to 3 mm and more preferably between 0.7 and 1.5 mm or between 0.3 and 1.3 mm. The expansion distance between the adjacent nozzles may be between 0.01-0.5 mm, preferably between 0.03-0.4 mm and more preferably between 0.05-0.3 mm. In one embodiment, the expansion distance is 0.2 mm. The expansion distance may be determined according to the operating temperature of the ALD process as the temperature difference between the operating temperature and the ambient temperature, for example normal room temperature, determines the thermal expansion.

In the present invention, the expansion distance is provided between adjacent nozzle in the nozzle head. When the nozzle head is heated to the process temperature which may be up to 350° C. or even more, the structures of the nozzle head including the nozzles go through thermal expansion. The expansion distance between the nozzle allows the nozzles to go through the thermal expansion without causing stresses or damages to the structure of the nozzle head. The thermal expansion of the nozzles further causes the expansion distance between nozzle side walls of adjacent nozzle to decrease to zero or close to zero such that the adjacent nozzles are sealed against each other. It is actually not necessary that the adjacent nozzles are sealed against each other, but there may remain a tiny gap between the nozzles in the operating temperature. However, this tiny gap should be considerably smaller than the depth of the at least one recess, for example between 0.01-0.05 mm. At the same time the at least one recess on the nozzle side wall provides the gas passage between the adjacent nozzles such that gas may flow from the nozzle top surface to the nozzle output surface. When inert purge gas is provided to the nozzle top surfaces it may flow via the gas passages between the adjacent nozzles to the nozzle output surface further sealing the adjacent nozzles. The purge gas may further separate precursor gases from adjacent nozzles at the output surface of the nozzle. Therefore, efficient high temperature sealing of nozzles in the nozzle head is achieved.

BRIEF DESCRIPTION OF THE DRAWINGS

The invention is described in detail by means of specific embodiments with reference to the enclosed drawings, in which FIGS. 1a, 1b and 1c show schematically one embodiment of a nozzle head according to the present invention;

FIG. 2 shows schematically a detailed view of the nozzle head of FIG. 1a;

FIGS. 3a, 3b and 3c show schematically another embodiment of a nozzle head according to the present invention;

FIGS. 4a and 4b show schematically one embodiment of a nozzle according to the present invention;

FIGS. 5a and 5b show schematically one embodiment of a nozzle of the present invention and installation of the nozzle to a body of the nozzle head;

FIGS. 6a and 6b show schematically one embodiment of the nozzle according to the present invention;

FIGS. 8a and 8b show schematically yet another embodiment of the nozzle according to the present invention;

DETAILED DESCRIPTION OF THE INVENTION

Figure 2:
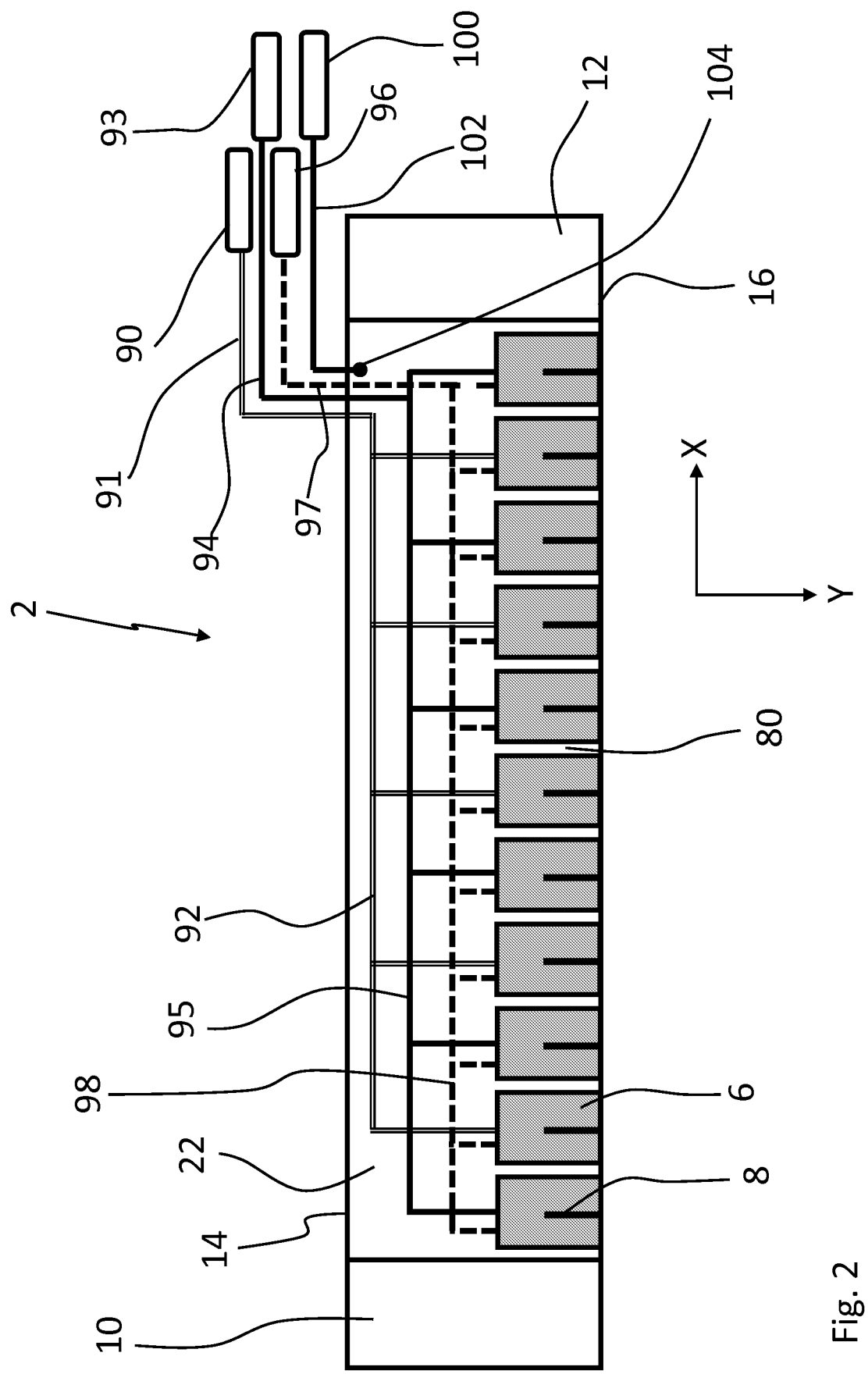

In this detailed description, the same structural parts of the nozzle head are denoted with same reference numerals. The structure of the part denoted with same reference numeral may vary from one embodiment to another, but they have a same purpose in the nozzle head.

FIG. 1a shows schematically a cross-sectional end view of a nozzle head 2 for subjecting a surface of a substrate to successive surface reactions of at least two precursors according to the principles of atomic layer deposition. The nozzle head of FIGS. 1a, 1b and 1c have a planar output surface 16. Accordingly, this kind of nozzle head 2 may be moved in linear oscillating movement relative to the surface of the substrate between a first and second end positions. The nozzle head 2 may be arranged to supply one or more precursor via an output surface 16 towards a surface of a substrate. The nozzle head 2 comprises a body 4. The body comprises first side structure 10 and a second side structure 12. The first and second side structures may be plates, sheets, flanges or the like, and preferably made of metal such as aluminium or steel. The body 4 further comprises a top structure 14 extending between the first and second side structures 10, 12. The top structure 14 may be a plate or sheet or the like, and preferably made of metal such as aluminium or steel. The nozzle head 2 further comprises two or more nozzles 6 or nozzle units having one or more nozzles 6. The nozzles 6 have a supply channel 8 and/or discharge channel open to the output surface 16 for supplying precursor gas and/or discharging gases. In the embodiment of FIG. 1a, there is nozzle head chamber 22 provided between the top structure 14 and the nozzles 6. However, the nozzle chamber 22 may also be omitted. The nozzles 6 or nozzle units are provided in connection with the output surface 16 for supplying the at least one precursor, as shown in FIG. 1a.

There is direction Y perpendicular, or transverse, to the output surface 16, as shown in FIGS. 1a, 2 and 3b. The wording "direction perpendicular or transverse to the output surface 16" means in this context direction which is exactly perpendicular to the output surface 16 or a direction in a small angle to the direction exactly perpendicular to the output surface 16. The small angle may be for example 0 to 15 degrees. The direction Y serves also as height direction relative to the output surface 16. There is also direction X parallel, or transverse, to the output surface 16, as shown in FIGS. 1a, 2 and 3b. The wording "direction parallel or transverse to the output surface 16" means in this context direction which is exactly parallel to the output surface 16 or a direction in a small angle to the direction exactly parallel to the output surface 16. The small angle may be for example 0 to 15 degrees. In the case of curved output surface 16, as in FIG. 3b, the parallel and perpendicular relate always a certain point or location of the output surface. For example, the directions Y and X shown in FIG. 3b relate to line B-B.

In this context term nozzle 6 means part having one or more gas supply channels open to the nozzle output surface and the output surface 16 of the nozzle head. One nozzle 6 may thus be arranged to supply one or more different precursors or gases forming thus a nozzle unit.

Precursor sources 90, 93 may be connected to the nozzle head 2 via precursor channels 91, 94 for supplying precursor gases to the nozzles 6. There may be a first precursor source 90 for supplying first precursor to first nozzles via a first precursor channel 91 and a second precursor source 93 for supplying second precursor to second nozzles via a second precursor channel 94. There may also be a discharge arrangement 96 connected to the nozzle head 2 with a discharge channel 97. The discharge arrangement may comprise a pump or the like for discharging gases from the output surface 16 of the nozzle head 2. A purge gas source 100 may also be connected to the nozzle head 2 via a purge gas channel 102 for supplying purge gas to the nozzle head 2.

In one embodiment, the first and second precursor sources 90, 93 and the discharge arrangement 96 are connected to the nozzles 6. The purge gas source 100 on the other hand is connected to the nozzle head chamber 22 for supplying the purge gas to the nozzle head chamber 22. The purge gas may be for example inert gas, such as nitrogen $N_2$. In an alternative embodiment, the first precursor source 90, the discharge arrangement 96 and the purge gas source 100 are connected to the nozzles 6. The second precursor source 93 on the other hand is connected to the nozzle head chamber 22 for supplying the second precursor to the nozzle head chamber 22.

FIG. 1b shows a schematic bottom view of the nozzle head 2 from the direction of the output surface 16. The body of the nozzle head 2 further comprises a first end structure 18 and a second end structure 20. The first and second end structure 18, 20 may be plates, sheets, flanges or the like, and preferably made of metal such as aluminium or steel. The nozzle units or nozzles 6 are arranged between the first and second end structure 18, 20, or arranged to extend between the first and second end structure 18, 20. Furthermore, the nozzle units or nozzles 6 may be supported to the first and second end structures 18, 20 directly or with a support part (not shown).

The nozzles 6 are arranged adjacently in a direction between the first and second side structures 10, 12, and between the first and second side structures 10, 12, as shown in FIG. 1b. Accordingly, the nozzles 6 from at least part of the output surface 16. Alternatively, the nozzle 6, and the first and second side structures 10, 12, and the first and second end structures 18, 20 together form the output surface 16. The output surface 16 is arranged towards the surface of the substrate at a predetermined distance such that a process gap is formed between the output surface 16 and the surface of the substrate during processing. The output surface 16 and the surface of the substrate are preferably conformal such that the shape of the output surface 16 and the shape of the surface of the substrate correspond each other for forming a uniform process gap.

As shown in FIGS. 1a and 1b, the adjacent nozzles 6 are arranged at distance from each other in the direction of the output surface 16 such that there is a gap between the nozzle side walls of the adjacent nozzles. In other words, the adjacent nozzles are arranged at the distance apart from each other and there is the gap extending transverse or perpendicularly to the output surface 6 between the adjacent nozzles.

FIG. 1c shows schematically a cross-sectional side view of the nozzle head 2 along line A-A of FIG. 1b. The nozzle 6 is arranged to extend between the first and second end structures 18, 20 and supported to the first and second end structures 18, 20. The nozzle 6 is further provided to the output surface 16 such that the nozzle 6 may supply precursor gas or discharge gas via the output surface 16. Accordingly, the nozzle 6 is installed to the nozzle head 2 by attaching it to the first and second end structures 18, 20 at the opposite ends of the nozzle 6 such that the nozzle 6 forms at least part of the output surface 16.

FIG. 1c further shows, that the nozzle head chamber 22 is provided between the top structure 14 of the nozzle head and the nozzles 6, and further also between the first and second end structures 18,20. In this embodiment the purge gas source 100 is connected to the nozzle head chamber 22 via the purge gas channel 102 for supplying purge gas into the nozzle head chamber 22. Accordingly, the nozzle head chamber 22 may be provided with purge gas atmosphere.

FIG. 2 shows the supply of precursors and purge gas and also the discharge in greater detail. The nozzle head 2 further comprises precursor conduits 92, 95, discharge conduit 98 and purge gas inlet 104. The precursor conduits 92, 95 and discharge conduit 98 are provided inside the nozzle head chamber 22. The precursor conduits 92, 95 and discharge conduit 98 are formed as branch conduits for distributing precursor gases to separate nozzles 6 and to provide discharge from separate nozzles 6. The first precursor conduit 92 is connected to the first precursor channel 91 and comprises first branches for distributing the first precursor to the first precursor nozzles 6. The second precursor conduit 95 is connected to the second precursor channel 94 and comprises second branches for distributing the second precursor to the second precursor nozzles 6. Discharge conduit 98 may comprise discharge branches and may be connected to each separate nozzle 6. Normally, there may be two discharge branches connected to each nozzle 6. Accordingly, this means that the nozzle output surface 46 may comprise two discharge channels on opposite sides of the precursor channels, or two branches may be connected to a one discharge channel 48, like the one shown in FIG. 4a. The nozzle head chamber 22 is further provided purge gas inlet 104 connected to the purge gas channel 102 for supplying the purge gas into the nozzle head chamber 22. Accordingly, the conduits 92, 95 and 98 are provided into the nozzle head chamber 22 in the purge gas atmosphere. It should be noted that, in alternative embodiment, there may be purge gas conduit comprising purge gas branches for distributing purge gas to the nozzles 6, and the second precursor may be supplied into the nozzle head chamber 22 via precursor inlet.

As shown in FIG. 2, the nozzles 6 are provided separate nozzles 6. The nozzles 6 are arranged adjacent to each other between the side structures 10, 12 such that they as are the expansion distance from each other and there is the expansion gap 80 between the adjacent nozzles 80. The expansion gap 80 extends from the nozzle output surface to the nozzle top surface and from first ends of the nozzle 6 to second end of the nozzle 6.

FIGS. 3a, 3b and 3c show schematically another embodiment of the nozzle head 2. FIG. 3a shows schematically bottom view of the nozzle head 2 in from the direction of the output surface 16. FIG. 3b shows a schematic cross sectional end view of the nozzle head 2. In this embodiment, the nozzle head 2 comprises a curved output surface 16. The curved output surface 16 is curved in the direction between the first and second side structures 10, 12. The curved output surface 16 has a curvature axis and the output surface 16 is circularly curved or is part of cylinder surface. In the embodiment of FIGS. 3a, 3b and 3c, the output surface 16 is provided as a concave surface. In another embodiment, the curved output surface may also be provided as convex surface. Furthermore, it should be noted that the curved output surface 16 may be preferable, but the present invention is not limited to any special kind of output surface 16.

The nozzles 6 extend between the first and second end structures 18, 20 and are arranged adjacent to each other in a direction between the first and second side structures 10, 12, similarly as is FIGS. 1a, 1b and 1c. The nozzle 6 is arranged to extend between the first and second end structures 18, 20 in a direction parallel to curvature axis of the output surface 16 and supported to the first and second end structures 18, 20.

FIG. 3c shows schematically a cross-sectional side view of the nozzle head 2 along line B-B of FIG. 3b. The nozzle 6 or nozzle unit is arranged to extend between the first and second end structures 18, 20 and supported to the first and second end structures 18, 20. The nozzle 6 is further provided to the curved output surface 16 such that the nozzle 6 may supply precursor gas or discharge gas via the output surface 16. Accordingly, the nozzle 6 or the nozzle unit is installed to the nozzle head 2 by attaching it to the first and second end structures 18, 20 at the opposite ends of the nozzle 6 or nozzle unit such that the nozzles 6 forms at least part of the curved output surface 16.

According to the above mentioned, the nozzle head 2 comprises at least two separate nozzles 6 comprising one or more nozzles 6. The at least two separate nozzle units are separately supported to the body 4 of the nozzle head 2. In this embodiment, the precursor sources 90, 93, the purge gas source 100 and the discharge arrangement 96 may be provided in the same manner as in FIGS. 1a, 1b and 1c.

FIGS. 4a and 4b show schematically a bottom view and side view of one nozzle 6. The nozzle 6 comprises a first end 42, a second end 44, a nozzle output surface 46, a nozzle top surface 47, a first nozzle side wall 41 and a second nozzle side wall 43. The nozzle output surface 46 and the nozzle top surface 47 are opposite to each other and extend between the first and second nozzle ends 42, 44, or on opposite sides of the nozzle 6. The first and second nozzle end 42, 44 comprise a first and second nozzle end surface, respectively. The first and second nozzle sides 41, 43 comprise first and second nozzle side surfaces, respectively. In the nozzle head 2, adjacent nozzles 6 are arranged such that the first nozzle side wall 41 of a nozzle 6 is towards a second nozzle side wall 43 of a first adjacent nozzle 6 and the second nozzle side wall 43 is against a first nozzle side wall 41 of a second adjacent nozzle 6.

It should be noted, that a nozzle unit comprising one or more nozzles may have the same structural features, meaning the first nozzle end 42, the second nozzle end 44, the nozzle output surface 46, the nozzle top surface 47, the first nozzle side wall 41 and the second nozzle side wall 43, and one or more adjacent precursor channels.

The nozzle output surface 46 comprises precursor supply channel or groove 8 open to the nozzle output surface 46, from which precursor supply channel 8 the precursor gas may be supplied. The precursor supply channel 8 may be a longitudinal channel extending in a direction between the first and second nozzle ends 42, 44 of the nozzle 6, or in the longitudinal direction of the nozzle 6. The precursor supply channel 8 is open to the nozzle output surface 46 and may comprise one or more supply opening 7 from which the precursor gas may flow to the precursor supply channel 8. The nozzle 6 may further comprise a distribution channel 9 inside the nozzle 6 for distributing the precursor gas to the one or more supply openings 7. The nozzle 6 may further comprise precursor conduit 88 for supplying precursor gas into the nozzle 6 and to the distribution channel 9.

The nozzle 6 of FIGS. 4a and 4b comprises a discharge channel 48, which is channel or groove open to the nozzle output surface 46. The discharge channel 48 arranged as circumferential channel surrounding the precursor supply channel 8. The discharge channel 48 is provided with discharge openings 49 via which precursor gases and possible other gases ay be discharged from the output surface 16. The discharge openings 48 are connected via discharge conduits 98 to the discharge arrangement 96.

It should be noted that the precursor supply channels, openings and conduits as well as discharge channels, openings and conduits may be formed and structured in several different ways and the present invention is not limited to them.

FIG. 5a shows a schematic top view of the nozzle 6. The nozzle 6 comprises the first nozzle end 42, the second nozzle end 44, the nozzle output surface 46, the nozzle top surface 47, the first nozzle side wall 41 and the second nozzle side wall 43. The nozzle 6 also comprises longitudinal axis X, or nozzle axis X, extending between the first and second nozzle end 42, 44 and in the middle between the first and second nozzle side wall 41, 43. Accordingly, the nozzle 6 has the first nozzle end 42, the second nozzle end 44 and the longitudinal axis C extending between the first and second nozzle ends 42, 44.

The nozzle 6 is separately supported to the body 4 of the nozzle head 2 with a support mechanism. The support mechanism comprises an upright attachment mechanism for attaching the separate nozzle 6 to the body 4 of the nozzle head 2 in the direction transverse or perpendicular to the output surface 16. The support mechanism also comprises a lateral attachment mechanism for attaching the separate nozzle 6 to the body 4 of the nozzle head 2, preferably in the direction of the output surface 16. The support mechanism further comprises an adjustment mechanism for adjusting position of the nozzle 6 relative to the body 4 of the nozzle head 2, preferably in the direction transverse or perpendicular to the output surface 16, or in height direction relative to the output surface 16 or adjacent nozzles 6.

As shown in FIGS. 5a and 5b, the lateral attachment mechanism is arranged to attach the nozzle 6 to the body 4 in lateral direction or in direction of the output surface 16. The lateral attachment mechanism comprises lateral fasteners 54, 55 for attaching the nozzle 6 to the body 4 in direction of the output surface 16 or the nozzle output surface 46. The lateral attachment mechanism comprises at least one first lateral fastener 54 arranged to attach the first nozzle end 42 of the nozzle 6 to the first end structure 18, and at least one second lateral fastener 55 arranged to attach the second nozzle end 44 of the nozzle 6 to the second end structure 20. The lateral attachment mechanism comprises lateral fasteners 54, 55 provided to the first and second ends 42, 44 of the nozzle 6, respectively, for attaching the nozzle 6 to the first and second end structures 18, 20. The lateral fasteners 54, 55 may be screws, bolts or the like fasteners. The first and second nozzle ends 42, 44 are further provided with threaded holes for receiving the lateral fasteners 54, 55. The lateral fasteners 54, 55 are preferably arranged to extend in the direction of the output surface 16 or the nozzle output surface 46. A first lateral fastener 54 is provided to or in connection with the first nozzle end 42 and the second lateral fastener 55 is provided to or in connection with the second nozzle end 44.

The first and second end structure 18, 20 comprise first and second inner surfaces 19, 21, respectively. The nozzles 6 are arranged between the first and second inner surfaces 19, 21. As shown in FIG. 5b, the nozzle 6 is supported to the first and second end structure 18, 20 such that the first end surface of first nozzle end 42 of the nozzle 6 is towards or against the first inner surface 19 of the first end structure 18, and the second end surface of second nozzle end 44 of the nozzle 6 is towards or against the second inner surface 21 of the second end structure 20. The body 4 of the nozzle head 2 is provided with lateral holes 56, 57 for receiving the lateral fasteners 54, 55. The lateral holes 56, 57 extend through the first and second end structures 18, 20 such that the lateral fasteners 54, 55 may extends through the first and second end structure 18, 20 to the nozzle 6 or to the threaded hole in the nozzle 6 for attaching the nozzle 6 first and second ends structures 18, 20.

The support mechanism for supporting the nozzle 6 to the body 4 comprises an upright attachment mechanism for attaching the nozzle 6 to the body 4 of the nozzle head 2 in the direction transverse or perpendicular to the output surface 16. The upright attachment mechanism comprises upright fasteners 52, 53 for attaching the nozzle 6 to the body 4 in direction transverse or perpendicular to the output surface 16 or the nozzle output surface 46. The upright attachment mechanism comprises at least one first upright fastener 52 arranged to attach the first nozzle end 42 of the nozzle 6 to the first end structure 18, and at least one second upright fastener 53 arranged to attach the second nozzle end 44 of the nozzle 6 to the second end structure 20. The upright fasteners 52, 53 may be screws, bolts or the like fasteners. According to the above mentioned, the upright fasteners 52, 53 are arranged to extend from the body 4 or from first and second end structures 18, 20 to the nozzle 6. The upright fasteners 52, 53 are arranged to extend in the direction transverse or perpendicular to the output surface 16 or nozzle output surface 46 for attaching the nozzle 6 to the body 4 or to the first and second end structures 18, 20 in the direction transverse or perpendicular to the output surface 16 or nozzle output surface 46.

FIGS. 6a and 6b show schematically one embodiment of a nozzle 6 according to the present invention. The nozzle 6 further comprises a recess 82 provided to the second nozzle side wall 43. The recess 82 extends between the nozzle top surface 47 and the nozzle output surface 46 for providing a gas passage from the nozzle top surface 47 to the nozzle output surface 46 when the second nozzle side wall 43 is against a counter surface. The recess 82 may be grove or the like. The recess 84 extend along the whole thickness E of the nozzle 6, or along the whole second nozzle side wall 43 in the direction perpendicular to the nozzle output surface 46, such that the recess is open to the nozzle top surface 47 and the nozzle output surface 46.

The nozzle 6 comprises one recess 82 provided to the second nozzle side wall 43 between the first and second nozzle ends 42, 44 in direction of the nozzle axis X. The recess 82 comprises a first recess side wall extending between the nozzle top surface 47 and the nozzle output surface 46 and from the second nozzle side wall 43 into the nozzle 6, and a second recess side wall 86 extending between the nozzle top surface 47 and the nozzle output surface 46 and from the second nozzle side wall 43 into the nozzle 6.

The recess has a depth T from surface of the second nozzle side wall 4, and that the depth T, meaning the width of the first and/or second recess side walls 84, 86. The depth T of the recess 82 may between 0.5 to 5 mm, preferably 0.5 to 3 mm and more preferably between 0.7 and 1.5 mm. In one embodiment, the depth T is 1 mm. In the mentioned examples, the depth T of the recess 82 may be uniform along from the nozzle top surface 47 to the nozzle output surface 46, or along the whole second nozzle side wall 43 in the direction perpendicular to the nozzle output surface 46. However, in an alternative embodiment the depth of the recess 82 may increase or decrease towards the nozzle output surface 46, gradually or stepwise.

The recess 82 has a width B in the direction of the nozzle axis N. The width B is uniform between the nozzle output surface 46 and the nozzle top surface 47. The nozzle output surface 46 comprises the at least one gas channel 8 and/or discharge channel 48 having a length C, D in the direction of the nozzle axis N. The length C of the at least one gas channel 8 in the direction of the nozzle axis N is smaller than the width B of the least one recess 82 in the direction of the nozzle axis N at the nozzle output surface 46, as shown in FIG. 6a. Furthermore, the length D of the at least one discharge channel 48 in the direction of the nozzle axis N may also be smaller than the width B of the least one recess 82 in the direction of the nozzle axis N at the nozzle output surface 46. This means that the at least one gas channel 8 and/or discharge channel 48 is provided between the first and second recess side walls 84, 86 at the nozzle output surface 46. Accordingly, the recess 82 extends on the nozzle output surface 46 past the ends to the gas channel 8 and the discharge channel 48 in the direction of the nozzle axis at the nozzle output surface 46.

The nozzle 6 has a length A between the first and second nozzle end 42, 44 in the direction of the nozzle axis N. The length A of the nozzle 6 is greater than the width B of the at least one recess 82 in the direction of the nozzle axis N at the nozzle output surface 46. The first recess side wall 84 is at a first distance from the first nozzle end 42 and the second recess side wall 86 is at a second distance from the second nozzle end 44 at the nozzle output surface 46, such that the length A of the nozzle 6 is greater than the width B of the at least one recess 82 in the direction of the nozzle axis N at the nozzle output surface 46. Accordingly, this means that the recess 82 is not open to the first and second nozzle end 42, 44, and there is at least a small portion of side wall surface between the first recess side wall 84 and the first nozzle end 42 and between the second recess side wall 86 and the second nozzle end 44.

In the present invention at least one recess may be also provided to the first and/or second end 42, 44 of the nozzle 6 in the manner as the at least one recess 82 on nozzle side walls 41, 43. The at least one recess 82 may extend from the nozzle top surface 47 to the nozzle output surface 46 at end surface of the first and/or second ends 42, 44. Accordingly, it should be noted that when at least one recess is provided to the first and/or second end 42, 44 of the nozzle 6, all that is described in relation to recess 82 in the nozzle side walls 41, 43 also apply to the recess in the first and second end 42, 44. In this case the recess is provided between the body 4 of the nozzle head 2, or respectively first and/or second end structure 18, 20, and the first and/or second end of the nozzle 6.

Furthermore, there may also be an expansion gap between the first and second nozzle end 42, 44 and the body 4 of the nozzle 2, or between the first and 42 and the first end structure 18 and between the second end 44 and the second end structure 20. Also in this case, all that is described in relation to the expansion gap 80 apply also to the expansion gap between the nozzle ends 42, 44 and the body 4.

Figure 7B:
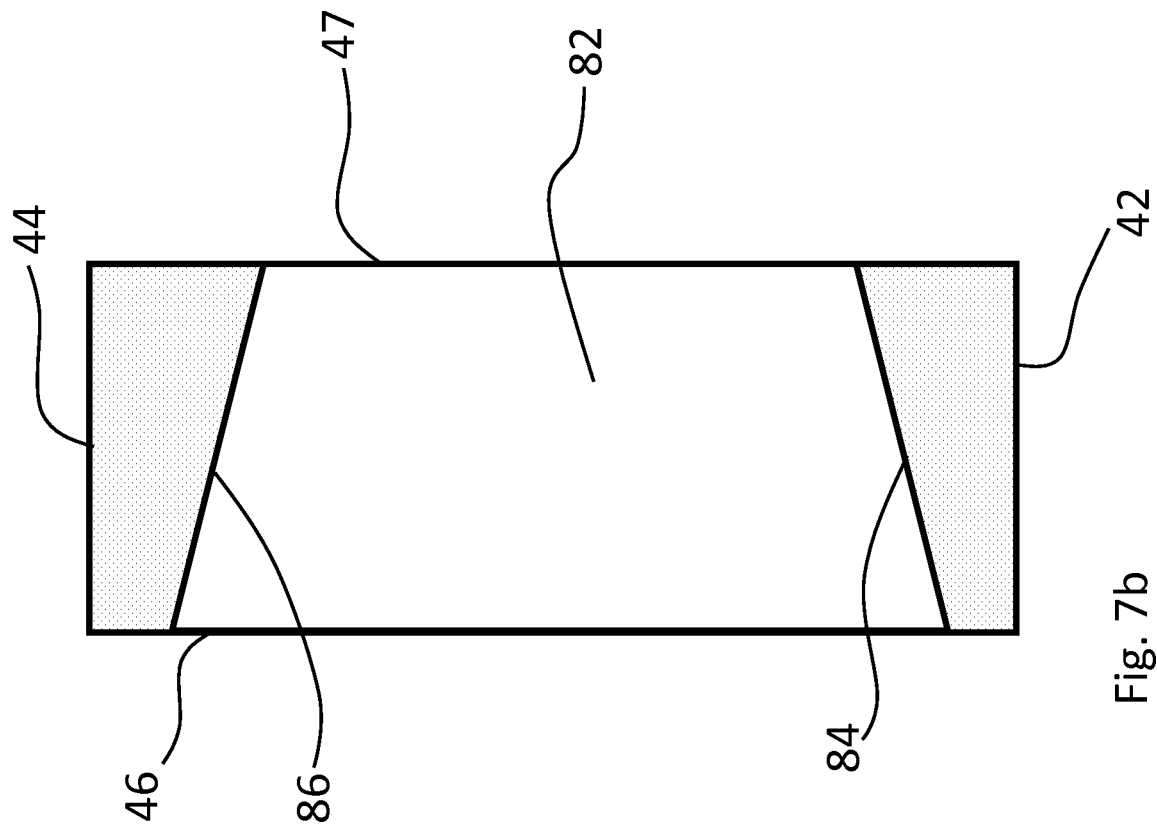
FIGS. 7a and 7b show schematically another embodiment of the nozzle according to the present invention.
Figure 7A:
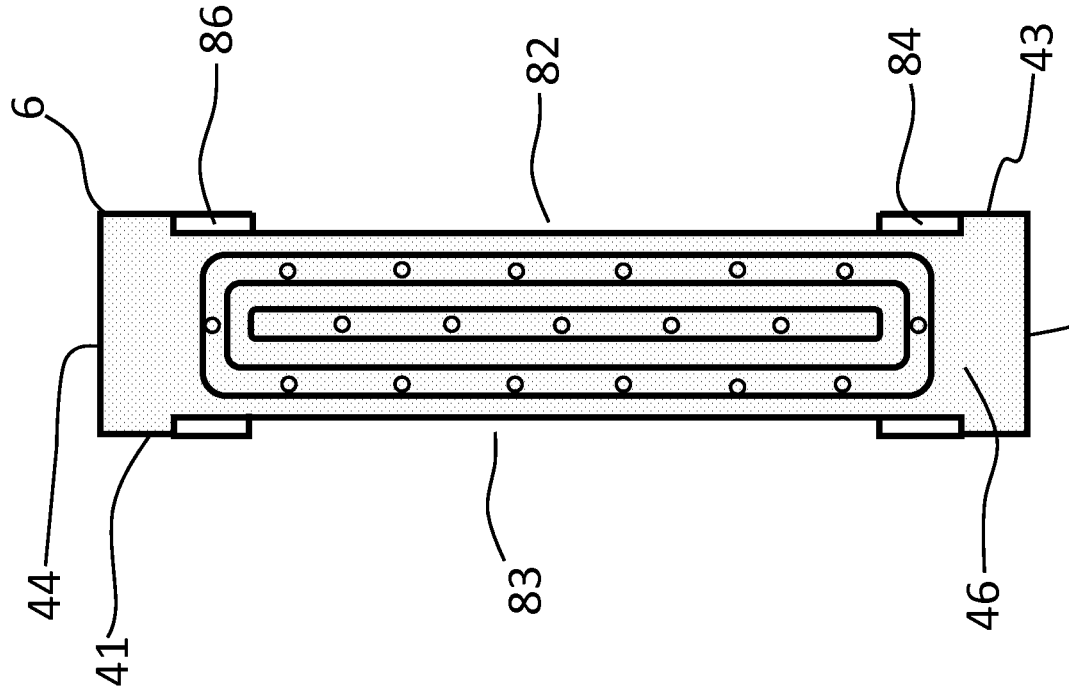

FIGS. 7a and 7b show an alternative embodiment in which the recess 82 is provided to both the first nozzle side wall 41 and to the second nozzle side wall 43. In this embodiment, the width B of the recess 82 in the direction of the nozzle axis N decreases gradually from the nozzle output surface 46 towards the nozzle top surface 47. Accordingly, the first and second recess side walls 84, 86 are inclined relative to each and converge each other towards the nozzle top surface 47. Thus, the width B of the at least one recess 82 in the direction of the nozzle axis N is greater at the nozzle output surface 46 than at the nozzle top surface 47.

In alternative embodiment, the width B of the recess 82 in the direction of the nozzle axis N may increase from the nozzle output surface 46 towards the nozzle top surface 47. Thus, the width B of the recess 82 in the direction of the nozzle axis N may be greater at the nozzle top surface 47 than at the nozzle output surface 46. The width B of the recess 82 may change gradually, as in FIG. 7*b*, or stepwise between the nozzle top surface 47 and the nozzle output surface 46.

FIGS. 8*a* and 8*b* show yet on alternative embodiment in which the second nozzle side wall 43 comprises two or more, actually five, separate recesses 82 provided successively to the second nozzle side wall 43 between the first and second nozzle ends 42, 44 in direction of the nozzle axis N.

In the embodiment of FIGS. 8*a* and 8*b*, the five recesses 82 comprise the first recess side wall 84 extending between the nozzle top surface 47 and the nozzle output surface 46 and from the second nozzle side wall 41, 43, and a second recess side wall 86 extending between the nozzle top surface 47 and the nozzle output surface 46 and from the second nozzle side wall 41, 43. The at least one gas channel 8 and or the discharge channel 48 is provided between the first recess side wall 84 of a first of the successive recesses 82 and the second recess side wall 86 of a last of the successive recesses 82 along the direction of the nozzle axis N from the first nozzle end 42 to the second nozzle end 44 at the nozzle output surface 46.

In this embodiment, the first recess side wall 84 of the first of the successive recesses 82 along the direction of the nozzle axis N from the first nozzle end 42 to the second nozzle end 44 is at a first distance from the first nozzle end 42 and the second recess side wall 86 of the last of the successive recesses 82 along the direction of the nozzle axis N from the first nozzle end 42 to the second nozzle end 44 is at a second distance from the second nozzle end 44 such the distance between the that the first recess side wall 84 of the first of the successive recesses 82 and the second recess side wall 86 of a last of the successive recesses 82 is smaller than the length A of the nozzle 6. Accordingly, this means that none of the recesses 82 is open to the first and second nozzle end 42, 44, and all the recesses 82 are provided at least a small distance from the first and second nozzle ends 42, 44. Thus, there is small portion of side wall surface between the first recess and the first nozzle end 42 and the last recess 82 and the second nozzle end 44 along the direction of the nozzle axis N from the first nozzle end to the second nozzle end 44.

Figure 9:
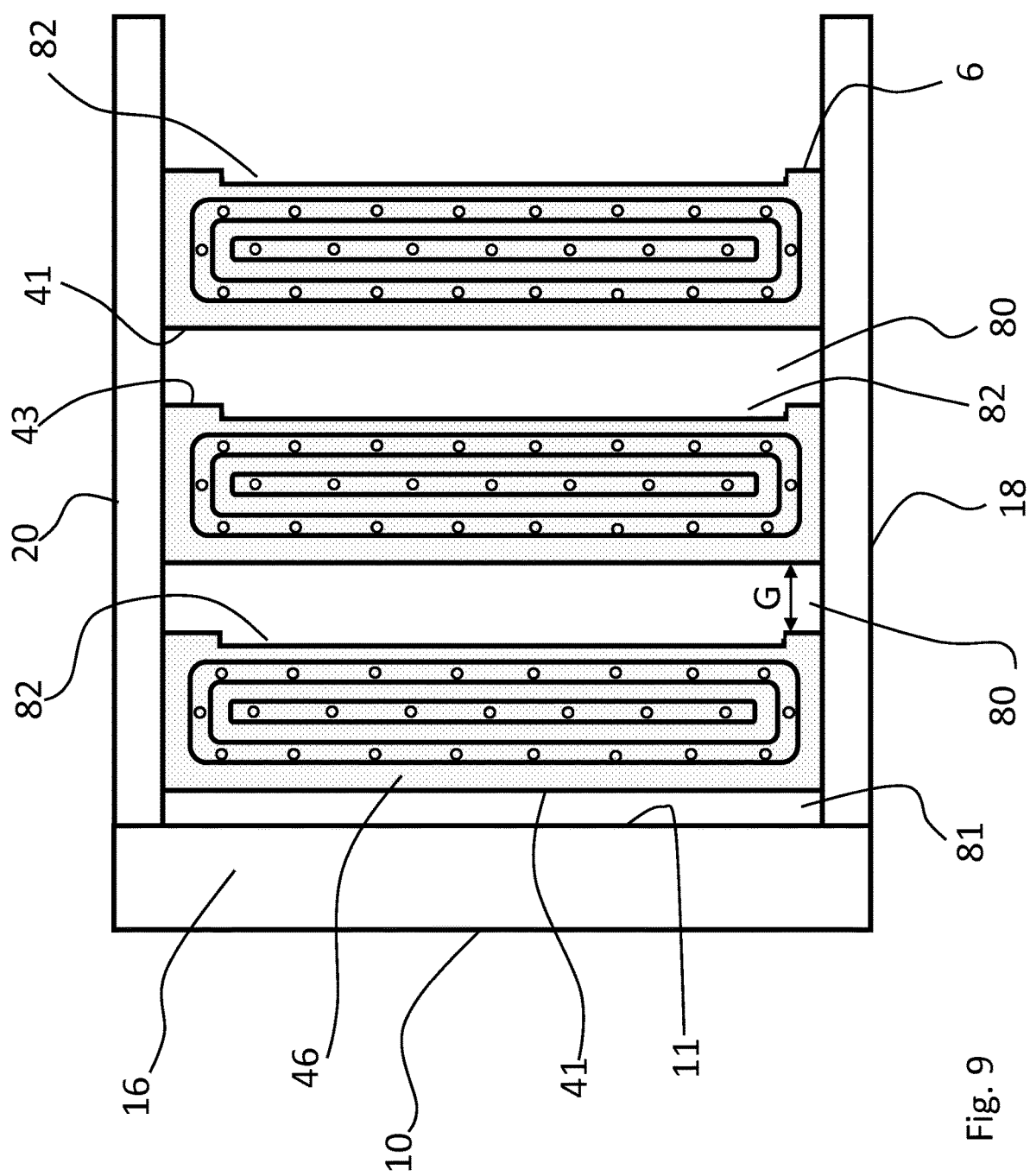
FIG. 9 shows schematically a bottom view of one embodiment of a nozzle head according to the present invention.

FIG. 9 shows a schematic partial top view of a nozzle head 2 with the separate nozzle 6 when the nozzle head 2 is not in use in elevated process temperature. The two or more nozzles 6 are arranged extend between the first and second end structures 18, 20 and arranged adjacent to each other in a direction between the first and second side structures 10, 12. As shown in FIG. 9, adjacent nozzles 6 of the two or more nozzles 6 are arranged at an expansion distance G from each other in the direction of the output surface 16 such that there is an expansion gap 80 between the nozzle side walls 41, 43 of the adjacent nozzles 6. The expansion gap 80 allows the adjacent nozzles 6 to go through thermal expansion when the nozzle head 2 is heated t process temperature. There is also an expansion gap 81 between the outermost nozzle 6 and the first end structure 10. Similar expansion gap 81 may be provided between the other outermost nozzle 6 and the second end structure 12.

The separate nozzle 6 in FIG. 9 may be any kind of nozzles according to what is described in relating to FIGS. 4*a*, 4*b*, 5*a*, 5*b*, 6*a*, 6*b*, 7*a*, 7*b*, 8*a* and 8*b*. Therefore, the second nozzle side wall 43 comprises the recess 82 extending between the nozzle top surface 47 and the nozzle output surface 46.

Figure 10:
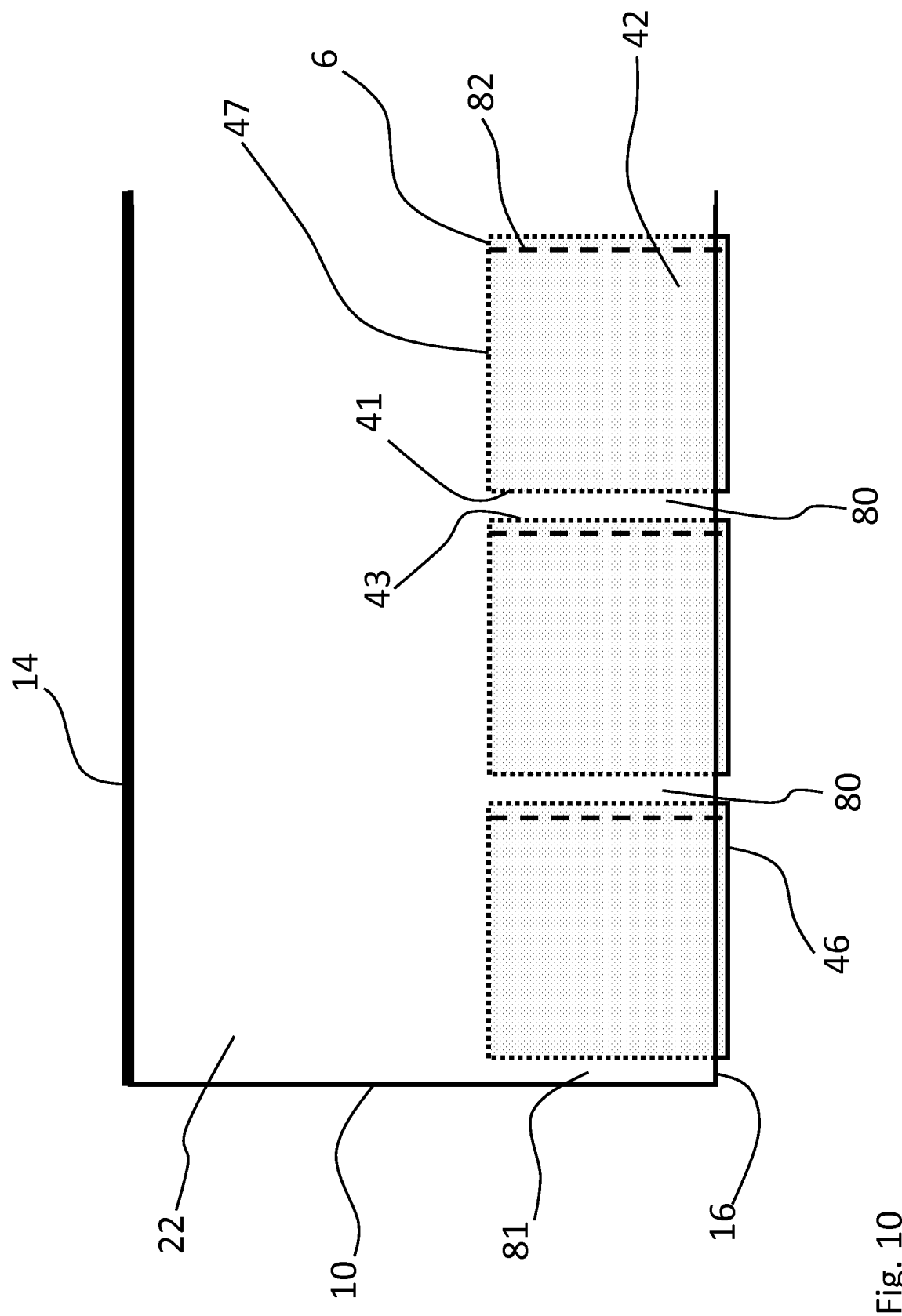
FIG. 10 shows schematically a side of the nozzle head of FIG. 9.

FIG. 10 shows a schematic side view of the nozzle head 2 of FIG. 9, when the nozzle head 2 is not heated to elevated process temperature. The nozzle head chamber 22 is provided in fluid communication with the nozzles 6, or above the nozzles 6 or between the nozzles 6 and the top structure 14. Thus, there is the expansions gaps 80 between the adjacent nozzles 6 allowing thermal expansion of the nozzles 6 in the direction of the output surface 16, or the nozzle output surface 46.

Figure 11:
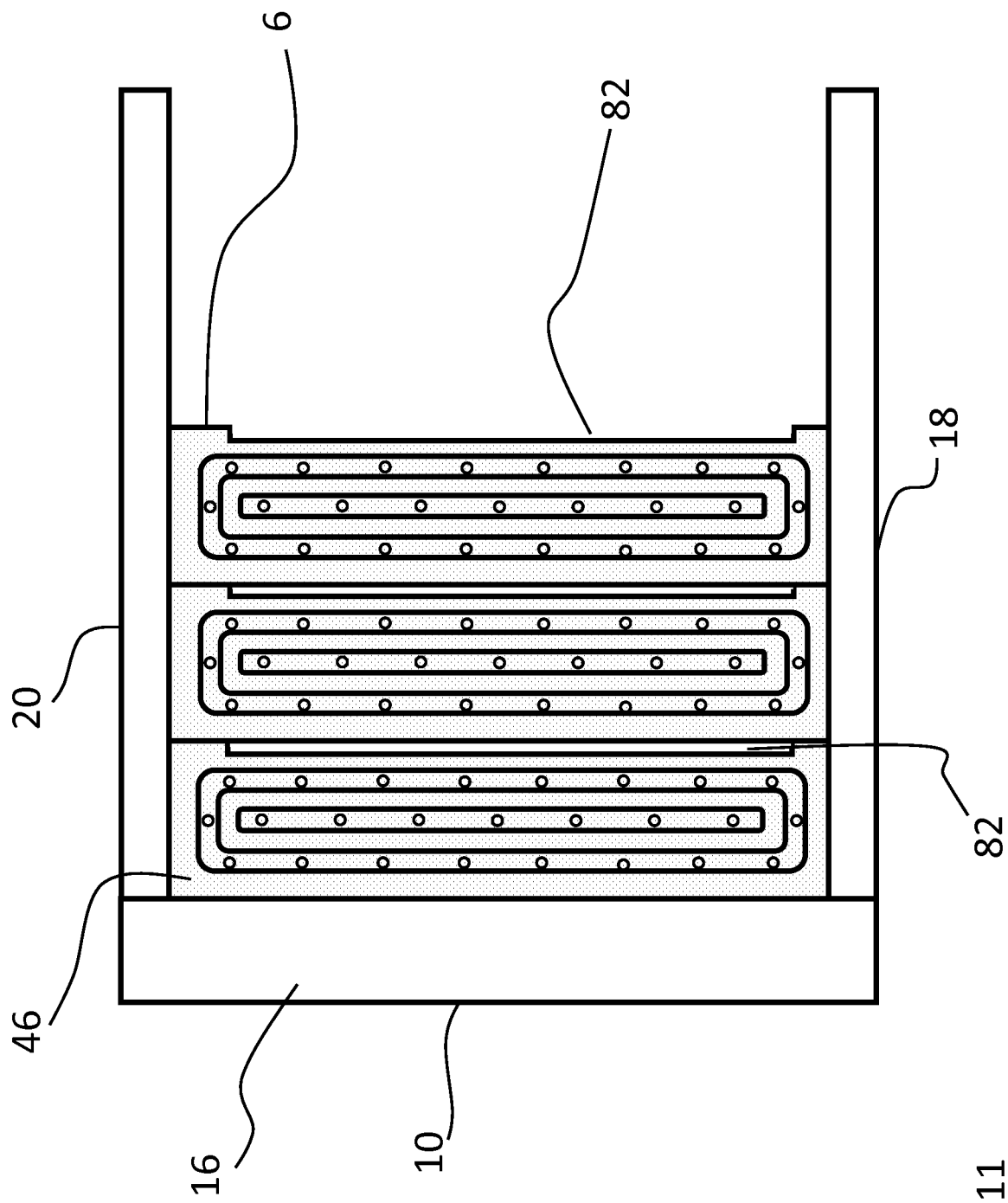
FIG. 11 shows schematically a bottom view of another embodiment of a nozzle head according to the present invention.

When the nozzle head 2 is heated to process temperature, the nozzles 6, and also other structures of the nozzle head 2, go through thermal expansion causing the expansion gaps 81, 80 to decrease to zero or almost zero. Thus, the nozzle side walls 41, 43 of adjacent nozzles 6 may expand against each other closing the expansion gap, as shown in FIG. 11. At this time, the recesses 82 provide gas passage between the adjacent nozzles 6 from the nozzle top surface 47 to the nozzle output surface 46 when the expansion gap 80 is closed. Accordingly, when the first nozzle side wall 41 is against a second nozzle side wall 43 of an adjacent nozzle 6, the recess 82 forms the gas passage between the adjacent nozzles 6.

Figure 12:
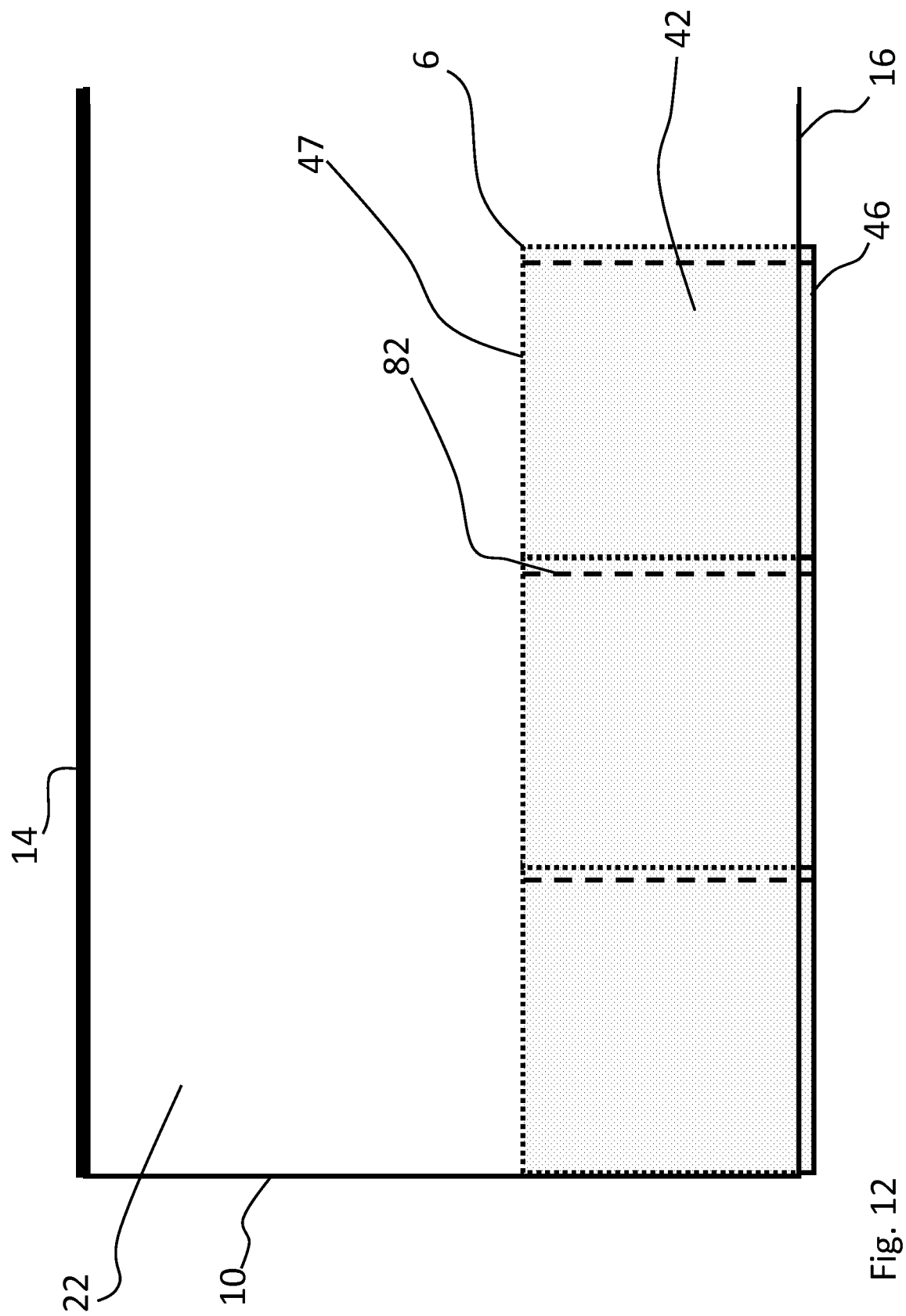
FIG. 12 shows schematically a side of the nozzle head of FIG. 11.

FIG. 12 shows the nozzle head 2 further in operating mode at elevated temperature. The adjacent nozzles 6 are against each other, or almost against each other such a tiny gap is between adjacent nozzles 6, and there are the gas passages provided with the recesses 82 between the adjacent nozzles 6 extending from the nozzle top surface 47 to the nozzle output surface 46. Accordingly, in a case in which gas, preferably purge gas, is supplied to the nozzle head chamber 22, the gas may flow to the output surface 16 via the gas passages provided with the recesses 82 between the nozzle top surface 47 to the nozzle output surface 46. This allows efficient sealing of the adjacent nozzles 6 against each other and also supply of purge gas to the output surface 16 of the nozzle head for separating different precursors supplied from adjacent nozzles 6.

The invention has been described above with reference to the examples shown in the figures. However, the invention is in no way restricted to the above examples but may vary within the scope of the claims.

The invention claimed is:

1. A nozzle head for use in atomic layer deposition for subjecting a surface of a substrate to successive surface reactions of at least two precursors, the nozzle head comprising:
   an output surface via which at least one precursor is supplied towards the surface of the substrate;
   two or more nozzles for supplying the at least one precursor, wherein each of the two or more nozzles comprising a nozzle output surface via which the at least one precursor is supplied towards the surface of the substrate, a nozzle top surface opposite the nozzle output surface and a pair of opposed first and second nozzle side walls extending between the nozzle output surface and the nozzle top surface, each of the first and second nozzle side walls including an outer side surface of the nozzle, the two or more nozzles are provided adjacent to each other at the output surface, such that the outer side surfaces of the first and second nozzle side walls of the two or more nozzles are towards each other,
   wherein the outer side surfaces of the first and second nozzle side walls of the adjacent nozzles of the two or more nozzles are arranged at an expansion distance (G) from each other in a direction of the output surface, and the first nozzle side wall comprises at least one recess having a depth (T) from the outer side surface of the first nozzle side wall and extending between the nozzle top surface and the nozzle output surface for providing a gas passage from the nozzle top surface to the nozzle output surface when the first and second nozzle side walls of the adjacent nozzles are against each other, wherein the at least one recess includes first and second recess side walls extending between the nozzle top surface and the nozzle output surface and defining the depth (T) of the at least one recess from the outer side surface of the first nozzle side wall in a direction towards the second nozzle side wall, wherein the at least one recess extends between the nozzle top surface and the nozzle output surface such that the at least one recess is open towards the nozzle top surface, the nozzle output surface, and a side wall of the adjacent nozzle; and a body defining a nozzle head chamber inside the body, wherein the nozzle head chamber is in fluid communication with the two or more nozzles, and the two or more nozzles are arranged to form at least part of a bottom wall of the nozzle head chamber, wherein the nozzle head chamber comprises a gas inlet configured to supply the at least one precursor into the nozzle head chamber for supplying the at least one precursor via the at least one recess through the output surface towards the surface of the substrate.

2. The nozzle head according to claim 1, wherein the body comprises:

a first side structure and a second side structure, and the two or more nozzles are arranged adjacent to each other in a direction between the first and second side structures; or a first side structure, a second side structure, a first end structure and a second end structure, and the two or more nozzles are arranged to extend between the first and second end structures and arranged adjacent to each other in a direction between the first and second side structures.

3. The nozzle head according to claim 1, wherein each of the two or more nozzles comprises a first nozzle end, a second nozzle end opposite the first nozzle end and a nozzle axis (N) extending between the first and second nozzle ends, and the nozzle output surface comprises at least one gas channel open to the nozzle output surface and having a length (C, D) in the direction of the nozzle axis (N), wherein the length (C, D) of the at least one gas channel in the direction of the nozzle axis (N) is smaller than a width (B) of the at least one recess in the direction of the nozzle axis (N) at the nozzle output surface;

at least one gas channel is provided between the first and second recess side walls at the nozzle output surface; or the at least one recess comprises two or more recesses provided successively to the first nozzle side wall between the first and second nozzle ends in the direction of the nozzle axis (N), and at least one gas channel is provided between the first recess side wall which is positioned adjacent a first of the two or more recesses and the second recess side wall which is positioned adjacent a last of the two or more recesses along the direction of the nozzle axis (N) from the first nozzle end to the second nozzle end at the nozzle output surface.

4. The nozzle head according to claim 1, wherein the depth (T) of the at least one recess is between 0.3 to 5 mm; and the expansion distance (G) is between 0.01-0.5 mm.

5. The nozzle head according to claim 1, wherein the depth (T) of the at least one recess is between 0.5 to 3 mm.

6. The nozzle head according to claim 1, wherein the depth (T) of the at least one recess is between 0.7 and 1.3 mm.

7. The nozzle head according to claim 1, wherein the depth (T) of the at least one recess is between 0.5 to 3 mm; and the expansion distance (G) is between 0.03-0.4 mm.

8. The nozzle head according to claim 1, wherein the depth (T) of the at least one recess is between 0.7 and 1.3 mm; and the expansion distance (G) is between 0.05-0.3 mm.

9. The nozzle head according to claim 1, wherein the at least one recess is at least one indentation formed in the outer side surface of the first nozzle side wall.

\* \* \* \* \*